United States Patent [19]
Jeon

[11] Patent Number: 6,159,791
[45] Date of Patent: Dec. 12, 2000

[54] FABRICATION METHOD OF CAPACITOR

[75] Inventor: Yoo Chan Jeon, Seoul, Rep. of Korea

[73] Assignee: Hyundai Electronics Industries Co., Ltd., Ichon-shi, Rep. of Korea

[21] Appl. No.: 09/366,553

[22] Filed: Aug. 4, 1999

[30] Foreign Application Priority Data

Dec. 8, 1998 [KR] Rep. of Korea ............ 98/53748

[51] Int. Cl.⁷ .................................. H01L 21/8242
[52] U.S. Cl. ................. 438/253; 438/239; 438/240; 438/244; 438/397; 438/396
[58] Field of Search .................... 438/239, 253, 438/381, 396, 244, 393, 397, 653, 3, 238, 240

[56] References Cited

U.S. PATENT DOCUMENTS

| | | | |
|---|---|---|---|
| 5,506,166 | 4/1996 | Sandhu et al. | 438/396 |
| 5,714,401 | 2/1998 | Kim et al. | 438/397 |
| 5,736,449 | 4/1998 | Miki et al. | 438/240 |

*Primary Examiner*—Charles Bowers
*Assistant Examiner*—Hsien-Ming Lee
*Attorney, Agent, or Firm*—Fleshner & Kim, LLP

[57] ABSTRACT

A fabrication method of a capacitor includes the steps of forming conductive regions in a semiconductor substrate, forming an insulation layer on the semiconductor substrate, forming contact holes over the conductive regions by etching the insulation layer, forming conductive plugs in the contact holes, forming a trench between adjacent conductive plugs by etching the insulation layer to a predetermined depth, forming a conductive layer on the entire structure obtained after the trench formation step, forming a lower electrode by etching the conductive layer using an anisotropic etching method, and forming a dielectric layer and an upper electrode on a surface of the lower electrode. The method decreases production costs of a capacitor and facilitates the processing steps.

25 Claims, 6 Drawing Sheets

FABRICATION METHOD OF CAPACITOR

BACKGROUND OF THE INVENTION

1. Field of the Invention

The present invention relates to a semiconductor device fabrication method, and more particularly, to a method of fabricating a capacitor.

2. Background of the Related Art

In order to increase the integration of semiconductor devices, such as DRAMs, attempts have been made to decrease the size of capacitors and transistors. However, decreasing the size of the capacitor results in decreased capacitance, and an excessive decrease of the capacitance can cause a DRAM to fail. Accordingly, several methods have been considered to increase the capacitance of a capacitor while still decreasing an area of a semiconductor substrate required to form the capacitor.

One method is to transform a capacitor into a three-dimensional shape, to increase the surface area of the capacitor electrodes, thereby increasing its capacitance. A background art fabrication method of a capacitor having a three-dimensional electrode will now be described with reference to FIGS. 1A–1E.

Figure 1A:
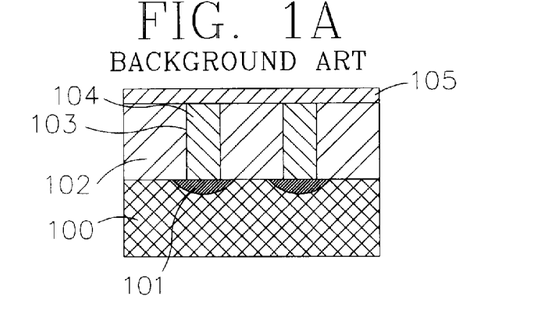
FIGS. 1A through 1E are cross-sectional views sequentially illustrating a background art method of fabricating a capacitor.

As shown in FIG. 1A, a semiconductor substrate 100 is doped with impurities to form a plurality of conductive regions 101. An interlayer insulation film 102 is formed on the semiconductor substrate 100. The interlayer insulation film 102 is etched to form contact holes 103 through the interlayer insulation film 102 at positions corresponding to the conductive regions 101. The contact holes 103 are filled with plugs 104 formed of a conductive material. Then, a barrier metal layer 105 is formed on upper surfaces of the plugs 104 and the interlayer insulation film 102.

Figure 1B:
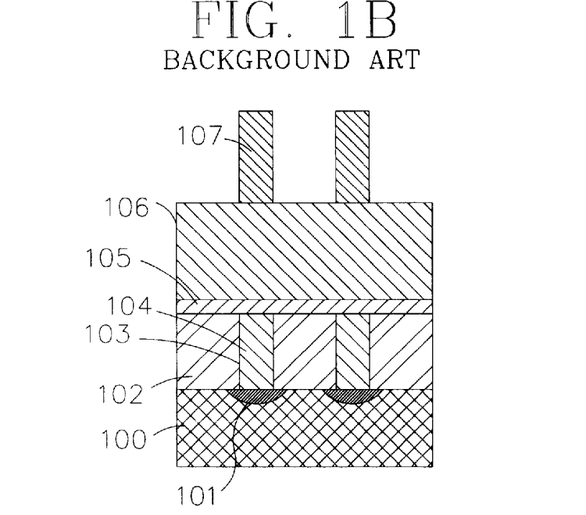

As further shown in FIG. 1B, a first conductive film 106 is formed on the barrier metal layer 105. A mask pattern 107 is formed on the first conductive film 106 at positions corresponding to the conductive plugs 104 and so that the elements of the mask pattern 107 are as large as the conductive plugs 104. The mask pattern 107 has a high etching selectivity against the first conductive film 106.

Figure 1C:
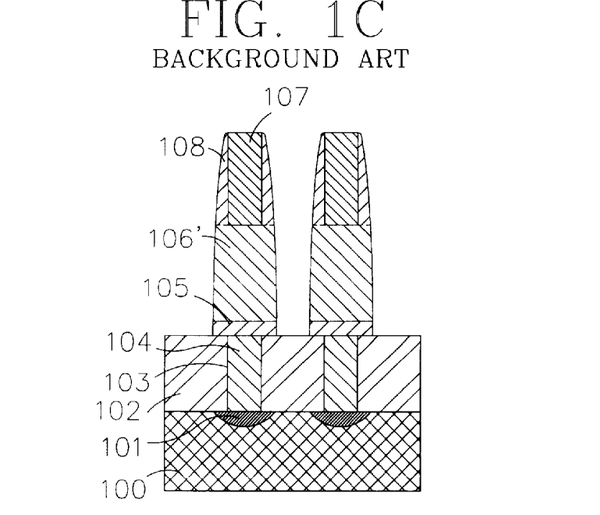

Referring to FIG. 1C, a second conductive film (not shown) formed of the same material as the first conductive film 106 is formed on the entire structure, and an anisotropical etching is carried out to obtain conductive side wall spacers 108 on each side wall of the elements of the mask pattern 107. Then, the first conductive layer 106 is patterned, using the mask pattern 107 and the sidewall spacers 108 as a mask, to form a first conductive layer pattern 106'.

Figure 1D:
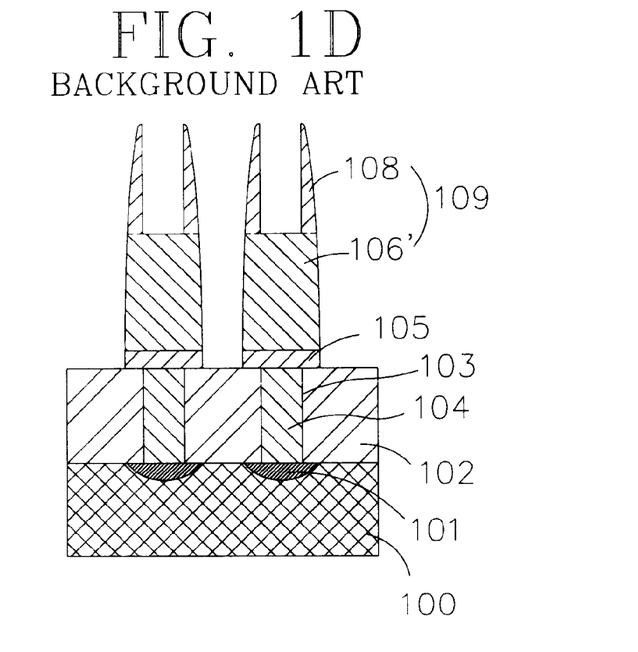

In FIG. 1D, the mask pattern 107 is removed to obtain a lower electrode 109 including the first conductive pattern 106' and the side wall spacers 108, which are shaped like horns on upper surface edge portions of the first conductive pattern 106'.

Figure 1E:
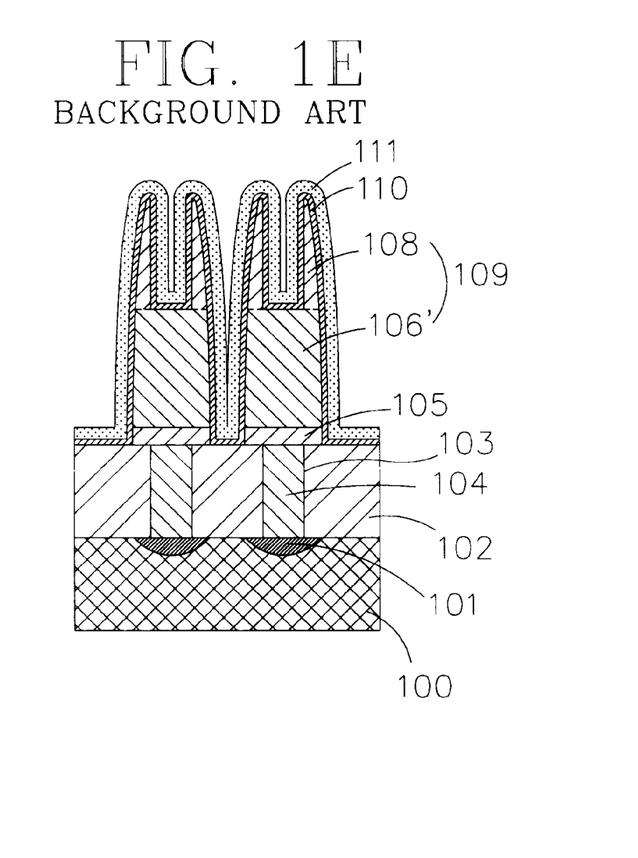

Then, as shown in FIG. 1E, a dielectric layer 110 and a third conductive layer (an upper electrode for the capacitor) 111 are sequentially formed on and along the outer surface of the lower electrode 109, thereby completing the capacitor fabrication.

Although the background art process results in a capacitor having three dimensional electrodes, which increases the capacitance of the device, the structure has several drawbacks. First, the height of the electrodes leads to significant irregularity along an upper surface of the semiconductor substrate. As a result, it becomes difficult to apply a microprocessing to films on such a rugged surface. Further, since the thickness of a film disposed on such an irregular surface can vary, electrical characteristics of the semiconductor device can be uneven. In the worst case, a short may occur at a stepped portion of such a film due to the irregular surface. The end result is a decrease in the reliability of a semiconductor device.

Another way to increase the capacitance of a capacitor is to use a dielectric layer material having a high permitivity. A dielectric layer generally adapted to a DRAM capacitor is usually formed as a silicon oxide layer or a nitride layer. The capacitance of a capacitor can be increased by replacing such a dielectric layer with a ferro electric material having high permitivity, such as $(Ba,Sr)TiO_3$, or $Pb(Zr,Ti)O_3$. However, when ferro electrics such as $(Ba,Sr)TiO_3$ or $Pb(Zr, Ti)O_3$ are used as a dielectric material layer, the material forming the lower electrode and the oxygen included in the ferro electric material tend to react at a high temperature, and an oxide film is formed on the surface of the lower electrode. To avoid this problem, studies are being conducted; wherein a material such as Pt which does not tend to oxidize, or a conductive film formed of materials such as Ru and Ir, which oxidize, but form a conductive oxide layer, are employed as the material for a lower electrode for the capacitor.

Unfortunately, it is difficult to use Pt, Ru, or Ir as a lower electrode for a capacitor because these materials are not easily etched. As a result, it is difficult to process these materials into the fine shapes required in highly integrated circuit devices.

Also, since the etching selectivity of such materials is not high with regard to a photoresist used as a mask during the etching, the photoresist must be formed in relatively thick layers. An excessively thick photoresist film makes it very difficult to form fine shapes using presently available photolithography techniques.

In addition, if an etching process is carried out according to a physical operation, the material adapted for a lower electrode of a capacitor may become deposited on a photoresist or sidewalls of the etched lower electrode, so that when the etching is completed, a thin film remains around the lower electrode, even after removing the photoresist, thereby deteriorating reliability of a semiconductor device.

SUMMARY OF THE INVENTION

The present invention is a capacitor structure and a method of fabricating the capacitor that overcomes disadvantages of the background art described above.

It is an object of the present invention to provide a capacitor having a lower electrode that is not as high as the lower electrode of a background art capacitor.

It is also an object of the invention to increase the capacitance of a capacitor by using a ferro electric material, thereby improving product reliability.

A method of fabricating a capacitor, embodying the invention, includes forming an insulation layer on a substrate; forming a contact hole in the insulation layer; forming a conductive plug in the contact hole; selectively etching portions of the insulation layer that surround the conductive plug; forming a first conductive layer over the insulation layer and the conductive plug; forming a dielectric layer over the first conductive layer; and forming a second conductive layer over the dielectric layer. The first and second conductive layers form first and second electrodes of the capacitor.

In alternate embodiments of the invention, the method could also include a step of forming conductive regions in the substrate prior to forming the insulation layer. In this instance, the contact holes would be formed within the insulation layer at positions corresponding to the conductive regions in the substrate.

In other embodiments of the invention, a barrier metal layer may be formed over top of the conductive plug before the first insulation layer is formed.

In still in other embodiments of the invention, the step of etching the insulation layer could comprise etching the insulation layer using the conductive plug as a mask. In this instance, the method could also include a step of forming sidewall spacers on the sidewalls of the conductive plug before the first conductive layers is formed.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings, in which like reference numerals refer to like elements, and wherein.

DETAILED DESCRIPTION OF PREFERRED EMBODIMENTS

Figure 2A:
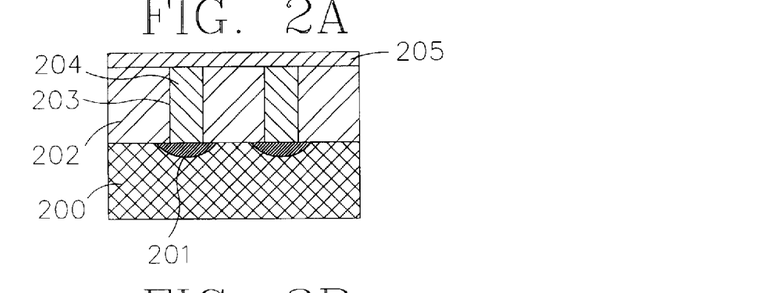
FIGS. 2A through 2G are cross-sectional views sequentially illustrating a fabrication method of a capacitor according to a first embodiment of the present invention.

A first method embodying the invention will be described with reference to FIGS. 2A–2G. As shown in FIG. 2A, a semiconductor substrate 200 is implanted with impurities to form a plurality of conductive regions 201. An interlayer insulation film 202, which can be a silicon oxide layer, is formed on the semiconductor substrate 200. The interlayer insulation film 202 can be formed using a chemical deposition method.

The interlayer insulation film 202 is then etched to form contact holes 203 through the interlayer insulation film 202 at positions corresponding to the conductive regions 201. A polysilicon layer doped with phosphorus (P) using a low pressure chemical deposition method is deposited into the contact hole 203 and on the interlayer insulation film 202. The polysilicon layer is etched to obtain conductive plugs 204 in the contact holes 203. A barrier metal layer 205 is then formed on the interlayer insulation film 202 and on the conductive plugs 204. The barrier metal layer 205 is preferably formed of a material selected from the group comprising TiN, WN, TiSiN, and WSiN.

Figure 2B:
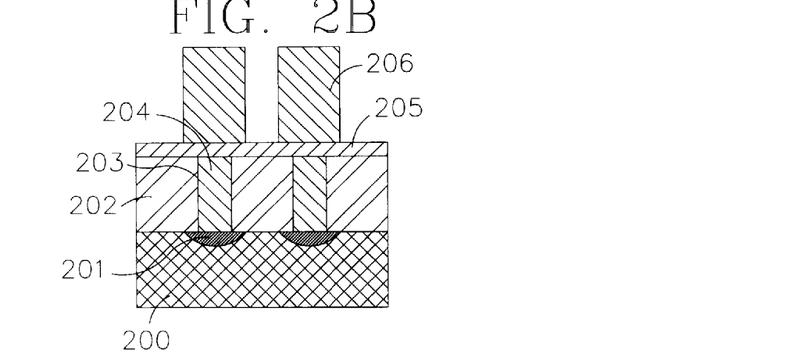

As shown in FIG. 2B, a photoresist is formed on the barrier metal layer 205 and patterned to obtain a photoresist pattern 206 having a plurality of elements that completely cover the conductive plugs 204. That is, the size of the elements of the photoresist pattern 206 is larger than that of the conductive plugs 204. The locations of the elements of the photoresist pattern 206 become locations for a lower electrode of the capacitor.

Figure 2C:
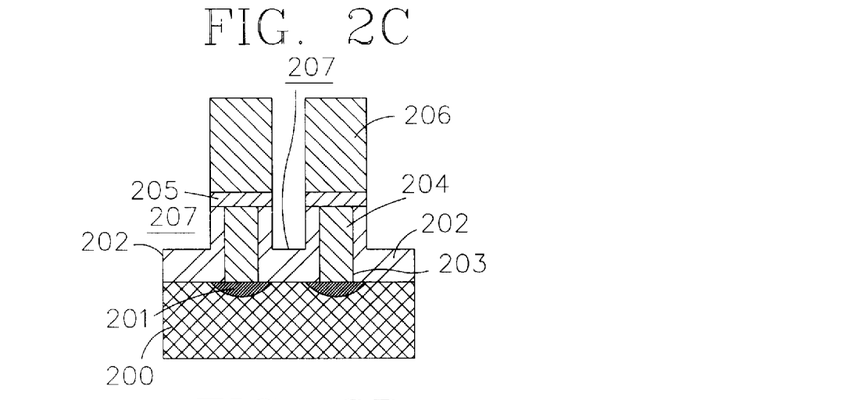

As shown in FIG. 2C, using the photoresist pattern 206 as a mask, the barrier metal layer 205 and the interlayer insulation film 202 is etched to obtain trenches 207. A lower electrode for the capacitor is subsequently formed on the side walls of the trenches 207. Thus, the deeper the depth of the trench 207, the larger the surface area of the capacitor.

Figure 2D:
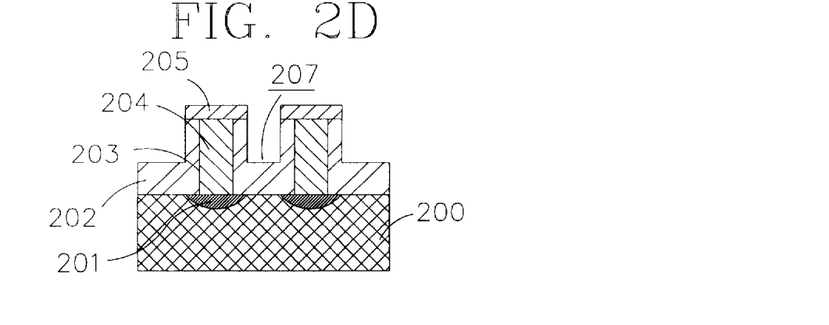

As illustrated in FIG. 2D, the photoresist pattern 206 is then removed.

Figure 2E:
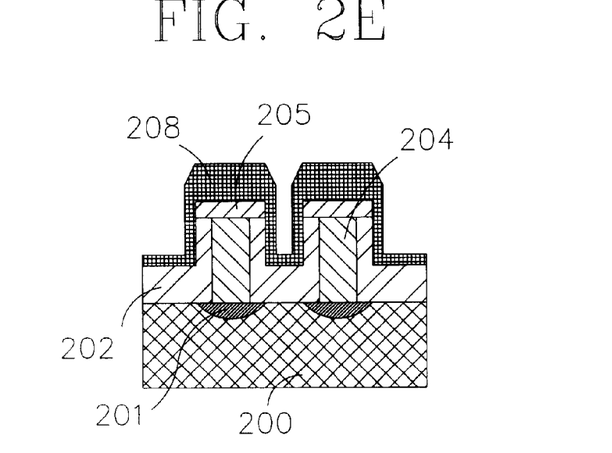

Referring to FIG. 2E, a first conductive layer 208, formed of a material selected from the group comprising Pt, Ru, Ir, $RuO_2$, and $IrO_2$, or one of their alloys, is disposed on the entire structure of the semiconductor device using a physical deposition method such as a sputtering method, or an e-beam evaporation method. The thickness of the first conductive film 208 formed on the side walls of the trench 207 is preferably more than approximately 100 Å.

When the first conductive film 208 is deposited on the semiconductor substrate, including the stepped portions, by a physical deposition method, the conductive film 208 is generally deposited in the shape shown in FIG. 2E. That is, the first conductive film 208 is relatively thin on the bottom surfaces of the insulation film 202 and on the side walls of the trench 207, and is relatively thick on the metal barrier layer 205. The physical deposition method causes the material particles (atoms) that form the first conductive film 208 to vertically fall and stack on the semiconductor substrate in a different way than would occur during a chemical deposition method, such that more of the particles tend to build up on the upper surface of the stepped high portion (the metal barrier layer 205). The material particles do not readily fall down to the bottom surface of the trench. Therefore, the portions of the first conductive film 208 formed on and along the interior side walls and bottom of the trench 207 are thinner than the portion of the film formed on the upper surface of the stepped high portions adjacent to the trench 207.

If the first conductive film 208 were formed by a chemical deposition method, a relatively thick film would also be formed in the interior of the trench. The physical deposition method is preferably selected instead of a chemical deposition method to avoid completely filling the trench 207 with the material of the first conductive film 208.

Figure 2F:
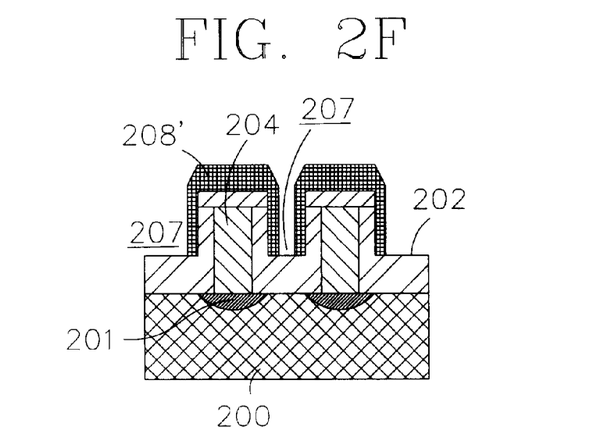

As shown in FIG. 2F, the portions of the first conductive film 208 formed on the surfaces of the insulation layer 202 are etched by an anisotropic etching method until the surfaces of interlayer insulation layer 202 are completely exposed. During the etching process, the portions of the first conductive film 208 on the surfaces of the insulation layer 202 are removed, and the portions of the first conductive film 208 formed on the side walls of the trench 207 and on the upper surface of the barrier metal layer 205 remain. This forms a first conductive pattern 208', which becomes a lower electrode of the capacitor.

As described above, the present invention does not require a fine processing technology such as photolithography. Only normal etching steps of normal sized features are required to form the lower electrode for a capacitor.

Figure 2G:
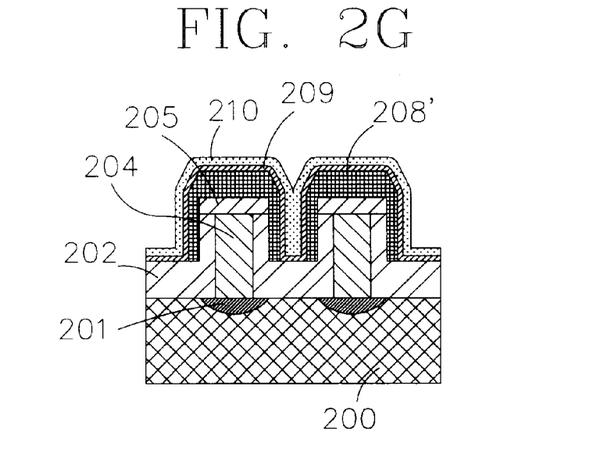

Referring to FIG. 2G, a dielectric layer 209, formed of a ferro electric such as $(Ba,Sr)TiO_3$, $Pb(Zr,Ti)O_3$ is formed over the entire top surface of the device shown in FIG. 2F. Next, a second conductive layer (an upper electrode of the capacitor) 210 is formed of a conductive material selected from polysilicon, tungsten, aluminum, molybdenum, Pt, Ru, Ir, $RuO_2$, $IrO_2$, Os, Rh, Pd, and their alloys, thereby completing the fabrication of the capacitor according to the first embodiment of the present invention.

Figure 3A:
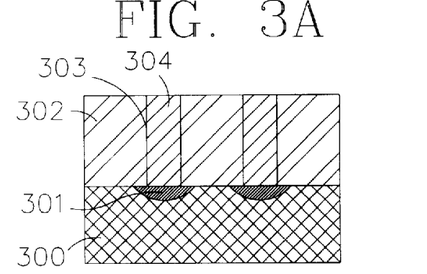
FIGS. 3A through 3G are cross-sectional views sequentially illustrating a fabrication method of a capacitor according to a second embodiment of the present invention.

A fabrication method for forming a capacitor according to a second embodiment of the present invention will now be described with reference to FIGS. 3A through 3G. First, as shown in FIG. 3A, a semiconductor substrate 300 is implanted with impurities to form a plurality of conductive regions 301. An interlayer insulation film 302, which may be a silicon oxide layer, is formed on the semiconductor substrate 300 using a chemical deposition method. The interlayer insulation film 302 is then etched to form contact holes 303 through the interlayer insulation film 302 at positions corresponding to the conductive regions 301. A polysilicon layer doped by phosphorus (P) using a low pressure chemical deposition method is filled into the contact holes 303, and deposited on the interlayer insulation film 302. The polysilicon layer is etched to obtain conductive plugs 304 in the contact holes 303.

Figure 3B:
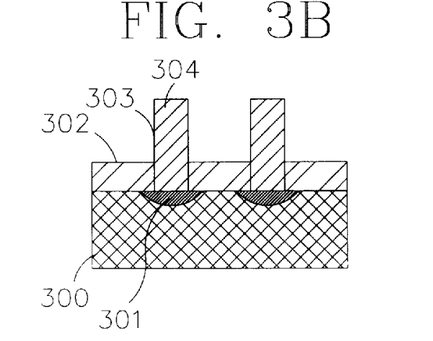

As further shown in FIG. 3B, using the plugs 304 as a mask, the interlayer insulation film 302 is etched to a predetermined depth so that the plug 304 is exposed over the upper surface of the interlayer insulation film 302.

Figure 3C:
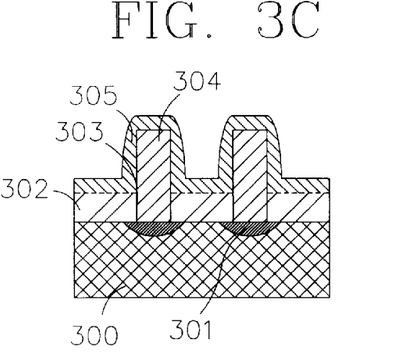
Figure 3D:
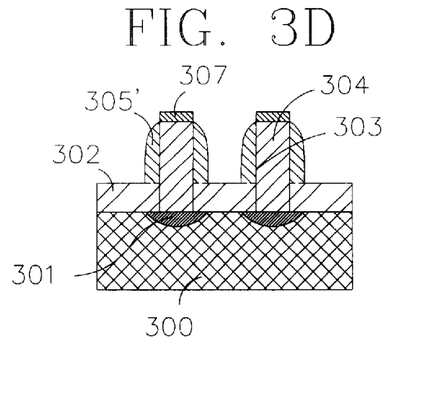

As shown in FIG. 3C, an insulation layer 305 is formed over the entire structure shown in FIG. 3B using a chemical deposition method. The insulation layer 305 is formed of a material which does not easily react with the plug 304. As shown in FIG. 3D, the insulation film 305 is etched without a mask pattern to obtain side wall spacers 305' formed on each side wall of the plugs 304. A barrier metal layer 307 is then selectively formed on the upper surfaces of the plugs 304.

Figure 3E:
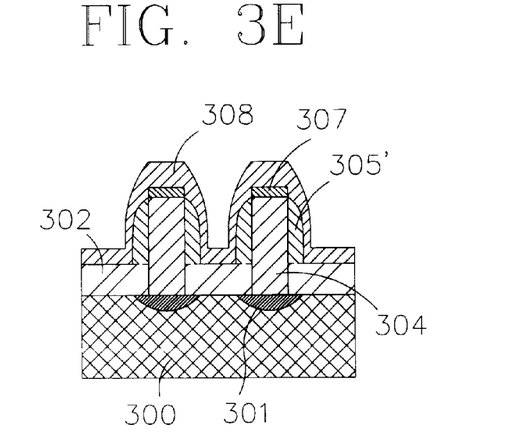

As illustrated in FIG. 3E, a first conductive film 308 is formed on the entire structure shown in FIG. 3D using a physical deposition method such as a sputtering or e-beam method. The first conductive film 308 is formed of a material selected from the group comprising Pt, Ru, Ir, Os, Rh, Pd, and oxides thereof. The first conductive film 308 is formed so that it is relatively thick over the upper surfaces of the barrier metal layer 307 and the side wall spacers 305', but relatively thin on the portions over the interlayer insulation layer 302.

Figure 3F:
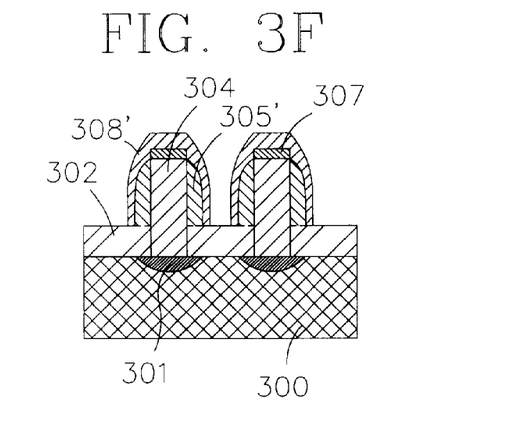

The first conductive film 308 is etched by an anisotropic etching method without using a mask so that the conductive film 308 only remains on the side walls of the side wall spacers 305' and the upper surface of the barrier metal layer 307, thereby obtaining a lower electrode 308' for the capacitor.

Figure 3G:
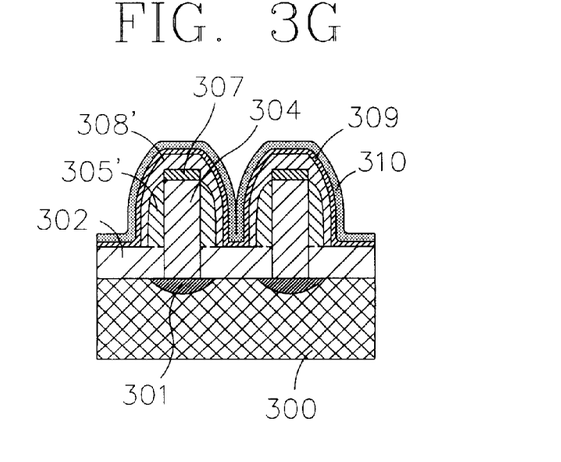

Then, as shown in FIG. 3G, a dielectric layer 309, formed of a ferro electric such as $(Ba,Sr)TiO_3$, $Pb(Zr,Ti)O_3$ is formed over the entire top surface of the device shown in FIG. 3F. A second conductive layer (an upper electrode of the capacitor) 310, formed of a conductive material selected from polysilicon, tungsten, aluminum, molybdenum, Pt, Ru, Ir, $RuO_2$, $IrO_2$, Os, Rh, Pd, and their alloys, is then formed over the dielectric layer 309. This completes the fabrication of the capacitor according to the second embodiment of the present invention.

As described above, the fabrication methods of a capacitor according to the present invention overcome the disadvantages of background art methods, in which a costly metal conductive material is thickly formed and patterned using a photo etching method to obtain the lower electrode for the capacitor. Such background art methods result in increased production costs due to the use of expensive metal materials.

In a fabrication method according to the present invention, however, a relatively thin film is formed for the lower electrode, thereby decreasing production costs of the capacitor. In addition, because the conductive layer for the lower electrode is thin, an etching time for the conductive layer is decreased compared to the conventional method in which a thick conductive layer is etched. Further, in the present invention, because the lower electrode layer is thin, the resist film can be thin, thereby facilitating the process, whereas a resist film used in a background art method has to be relatively thick in order to etch the thick electrode material, thereby lowering the resolution of the features.

Still further, in order to form a lower electrode of the capacitor in a method embodying the present invention, anisotropic etching methods can be used instead of a fine feature processing method such as photolithography and etching. This also facilitates the formation of the lower electrode for the capacitor.

Furthermore, in methods embodying the present invention, the interlayer insulation film formed over substrate is etched down during the fabrication process. The electrodes are then formed over the etched down insulation film. This reduces the height of the capacitor on the substrate as compared to background art methods.

Still further, methods embodying the present invention allow ferro electric materials to be used as the dielectric layer. The increased permitivity of the ferro electric material, as compared to the oxide or nitride layers used in background art methods, increases the capacitance of capacitors formed by methods of the present invention.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A method of fabricating a capacitor, comprising the steps of:

forming an insulation layer on a semiconductor substrate;

forming a plurality of contact holes in the insulation layer;

forming a plurality of conductive plugs in the contact holes such that top surfaces of the conductive plugs are substantially co-planar with a top surface of the insulation layer;

etching portions of the insulation layer surrounding the conductive plugs to a predetermined depth;

forming a conductive layer on the entire structure obtained after the etching step;

forming a lower electrode by etching the conductive layer using an anisotropic etching method;

forming a dielectric layer over the lower electrode; and forming an upper electrode on the dielectric layer.

2. The method of claim 1, wherein a plurality of conductive regions are formed in the substrate before the insulation layer is formed, and wherein the contact holes are formed in the insulation layer at positions corresponding to the conductive regions.

3. The method of claim 1, wherein, prior to conducting the etching step, a barrier metal layer is formed on the structure obtained after the conductive plug is formed, wherein the barrier metal layer is electrically connected to the plurality of conductive plugs, and wherein the etching step also comprises etching the barrier metal layer.

4. The method of claim 1, wherein the conductive layer is formed of a material selected from group consisting of Pt, Ru, Ir, $RuO_2$, $IrO_2$, and their alloys.

5. The method of claim 1, wherein the dielectric layer is formed of a material selected from the group consisting of $(Ba,Sr)TiO_3$ and $Pb(Zr,Ti)O_3$.

6. The method of claim 1, wherein the upper electrode is formed of a material selected from the group consisting of polysilicon, tungsten, aluminum, molybdenum, Pt, Ru, Ir, $RuO_2$, $IrO_2$, Os, Rh, Pd and alloys of these materials.

7. The method of claim 1, wherein the step of forming the conductive layer comprises a sputtering method.

8. The method of claim 1, wherein the step of forming the conductive layer is conducted so that portions of the conductive layer formed on the conductive plugs are thicker than portions of the conductive layer formed on the insulation layer.

9. The method of claim 1, wherein the etching step comprises etching the insulation layer using the conductive plugs as a mask, and further comprising a step of forming sidewall spacers on side walls of the conductive plugs.

10. The method of claim 9, wherein the step of forming a conductive layer comprises conducting one of an e-beam evaporation method and a sputtering method.

11. The method of claim 9, further comprising a step of forming barrier metal layer portions on upper surfaces of the conductive plugs after the side wall spacers are formed.

12. The method of claim 11, wherein the barrier metal layer portions are formed of a material selected from the group consisting of TiN, WN, TiSiN and WSiN.

13. The method of claim 9, wherein the step of forming an insulation layer comprises forming an insulation layer of a material that does not tend to react with the conductive plugs, and wherein the insulation layer is formed by a chemical deposition method.

14. The method of claim 1, wherein the step of etching portions of the insulation layer comprises the steps of:

forming a photoresist pattern over the insulation layer and the plurality of conductive plugs such that each portion of the photoresist pattern is located over a corresponding conductive plug; and etching portions of the insulating layer surrounding the conductive plugs to a predetermined depth using the photoresist pattern as a mask.

15. The method of claim 14, wherein each portion of the photoresist pattern has a width that is greater than a width of the corresponding conductive plug so that during the etching step, portions of the insulation layer surrounding the conductive plugs are not etched.

16. The method of claim 15, wherein the step of forming a conductive layer comprises depositing a conductive layer over the structure obtained after the etching step such that portions of the conductive layer cover side surfaces of the etched portions of the insulation layer surrounding the conductive plugs.

17. A method of fabricating a capacitor, comprising:

forming an insulation layer on a substrate;

forming a plurality of contact holes in the insulation layer;

forming a plurality of conductive plugs in the contact holes;

selectively etching portions the insulation layer that surround the conductive plugs to expose side surfaces of the conductive plugs;

forming a first conductive layer over the insulation layer and the conductive plugs;

selectively etching the first conductive layer to remove portions of the first conductive layer that overlie the insulation layer;

forming a dielectric layer over the first conductive layer; and forming a second conductive layer over the dielectric layer, wherein the first and second conductive layers form first and second electrodes of the capacitor, respectively.

18. The method of claim 17, further comprising a step of forming a barrier metal layer over top surfaces of the conductive plugs before the first conductive layer is formed.

19. The method of claim 17, wherein the step of forming a first conductive layer comprises forming the first conductive layer of a material selected from the group consisting of Pt, Ru, Ir, $RuO_2$ and $IrO_2$, and alloys of these materials.

20. The method of claim 17, wherein the step of forming a dielectric layer comprises forming the dielectric layer of a material selected from the group consisting of $(Ba, Sr)TiO_3$ and $Pb(Zr, Ti)O_3$.

21. The method of claim 17, wherein the step of forming a second conductive layer comprises forming the second conductive layer of a material selected from the group consisting of polysilicon, tungsten, aluminum, molybdenum, Pt, Ru, Ir, $RuO_2$, $IrO_2$, Os, Rh, Pd, and alloys of these materials.

22. The method of claim 17, wherein the step of selectively etching the insulation layer comprises etching the insulation layer using the conductive plug as a mask.

23. The method of claim 17, further comprising the steps of:

forming a sidewall insulating layer over the insulation layer and the exposed portions of the conductive plugs after performing the selective etching step; and etching the sidewall insulating layer to form sidewall spacers along the exposed side surfaces of the conductive plugs.

24. The method of claim 23, wherein the step of forming a first conductive layer comprises forming the first conductive layer over the insulation layer, the sidewall spacers, and the conductive plugs.

25. A method of fabricating a capacitor, comprising:

forming an insulation layer on a substrate;

forming a plurality of contact holes in the insulation layer;

forming a plurality of conductive plugs in the contact holes;

selectively etching portions the insulation layer that surround the conductive plugs to expose side surfaces of the conductive plugs;

forming a barrier metal layer over top surfaces of the conductive plugs;

forming a first conductive layer over the insulation layer, the conductive plugs and the barrier metal layer;

forming a dielectric layer over the first conductive layer; and forming a second conductive layer over the dielectric layer, wherein the first and second conductive layers form first and second electrodes of the capacitor, respectively.

* * * * *